United States Patent
Krishnan

[11] Patent Number: 5,998,299
[45] Date of Patent: Dec. 7, 1999

[54] PROTECTION STRUCTURES FOR THE SUPPRESSION OF PLASMA DAMAGE

[75] Inventor: Srikanth Krishnan, Plano, Tex.

[73] Assignee: Texas Instruments Incorporated, Dallas, Tex.

[21] Appl. No.: 08/987,728

[22] Filed: Dec. 9, 1997

Related U.S. Application Data

[60] Provisional application No. 60/032,995, Dec. 9, 1996.

[51] Int. Cl.⁶ .................................................. H01L 21/283
[52] U.S. Cl. ........................ 438/694; 438/132; 438/196; 438/281; 438/601; 216/18; 216/39; 216/75; 216/79
[58] Field of Search .................................... 438/132, 152, 438/155, 196, 207, 215, 218, 248, 273, 274, 281, 294, 314, 318, 324, 326, 333, 353, 361, 391, 601, 668, 669, 694, 700, 706, 710, 719, 720, 733, 734, 737; 216/13, 18, 39, 67, 75, 79

[56] References Cited

U.S. PATENT DOCUMENTS

| | | | |
|---|---|---|---|
| 5,691,234 | 11/1997 | Su et al. ................................. | 438/647 |
| 5,702,566 | 12/1997 | Tsui ........................................ | 438/694 |
| 5,767,006 | 6/1998 | Lee ......................................... | 438/597 |
| 5,817,577 | 10/1998 | Ko .......................................... | 438/694 |

OTHER PUBLICATIONS

IEDM, San Francisco, Dec. 1996, "Inductively Coupled Plasma (ICP) Metal Etch Damage to 35–60A Gate Oxide", (Srikanth Krishnan, W.W. Dostalik, Ken Brennan and Shian Aur).

*Primary Examiner*—Frankie L. Stinson
*Assistant Examiner*—Allan Olsen
*Attorney, Agent, or Firm*—Jacqueline J. Garner; Wade James Brady; Richard L. Donaldson

[57] ABSTRACT

Protection structures for suppressing plasma damage. Plasma damage is shown to occur primarily during a metal clear portion of a metal etch as opposed to also occurring during the overetch portion of the etch. The protection structures (202) provide a temporary connection between the metal layer (210) being etched and the substrate or a protection device during the clear portion of the etch. This temporary connection (202) is removed as the metal (210) is cleared.

25 Claims, 7 Drawing Sheets

TABLE 1

|  | SMALL ANTENNA | SMALL ANTENNA W/ SURROUNDING TOPO. |
|---|---|---|
| NO CONDUCTIVE FILM + 20SEC RE-ETCH | 1.00E-11 | 1.00E-11 |
| CVD ALUMINUM 690A + 20SEC RE-ETCH | 2.00E-05 | 6.00E-10 |
| CVD TIN 200A + 20SEC RE-ETCH | 1.00E-03 | 5.00E-09 |

PROTECTION STRUCTURES FOR THE SUPPRESSION OF PLASMA DAMAGE

This application claims priority under 35 USC § 119 (e)(1) of provisional application number 60/032,995, filed Dec. 9, 1996.

FIELD OF THE INVENTION

This invention generally relates to protection of devices from plasma damage during semiconductor processing.

BACKGROUND OF THE INVENTION

Process-induced damage is becoming a very serious concern for semiconductor device manufacturers. Such damage accounts for device degradations and lower yields. One type of process-induced damage can occur during ash, plasma etch and plasma enhanced deposition processes (collectively referred to as plasma charging damage), and ion implantation. Charge-induced damage is becoming particularly important due to: the scaling down of gate oxide thicknesses and channel length with succeeding technologies; increasing levels of metalization; and the advent of high density plasma sources for etching and deposition.

With respect to charge-induced damage, the charge collected in the antenna stresses the oxide of a device. More specifically, in a MOSFET structure, the charge collected on the antenna stresses the gate oxide of the MOSFET, thereby inducing stress-related degradation of the MOSFET. This stress-related degradation may include: shortening the lifetime of the device, increasing the gate leakage of the device, or shifting the threshold voltage of the device.

Advanced technology nodes now require 5 and 6 levels of metallization. This results in multiple wafer exposures to the metal etch reactors. This combined with the decrease in gate oxide thickness to 60 Å and below make plasma damage a primary concern during metal etch process development. Accordingly, there is a need to better understand the mechanisms of the plasma damage and to develop an approach for minimizing this damage.

SUMMARY OF THE INVENTION

Protection structures for suppressing plasma damage are disclosed herein. Plasma damage is shown to occur primarily during a metal clear portion of a metal etch as opposed to the overetch portion of the etch. The protection structures proposed herein provide a temporary connection between the metal layer being etched and the substrate prior to and during the clear portion of the etch. This temporary connection is removed by the etch itself during the overetch portion without the need for any additional steps.

An advantage of the invention is suppression of plasma charging damage using a temporary connection that is not present in the final device.

Another advantage of the invention is suppressing the latent antenna effect when etching closely spaced metal structures. The term latent antenna effect is used to refer to when the antenna effect of a conductor is raised to that of the surrounding geometry during the clearing portion of a metal etch.

These and other advantages will be apparent to those of ordinary skill in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is described herein in conjunction with an inductively-coupled plasma (ICP) metal etch. It will be apparent to those of ordinary skill in the art that the benefits of the invention are applicable to reducing plasma charging damage in general including plasma damage from other types of reactors and plasma damage during etches of material other than metal (for example, polysilicon).

As gate oxide thicknesses on semiconductor devices scale below 60 Å, damage from plasma metal etches (such as ICP metal etches) occurs. Experiments were conducted to better understand the mechanisms of the plasma damage and to develop ways to suppress the damage.

EVALUATION OF PLASMA DAMAGE

Charging is detected using a testchip incorporating antenna structures connected to CMOS devices or circuits. Fuses employed in this testchip are delinked (by plasma etch) in instances where precise electrical measurements are needed. Epitaxially grown p-type silicon wafers were processed using a CMOS process flow targeted for 0.25 μm node (50–60 Å gate oxide) or 0.18 μm node (35 or 45 Å gate oxide). Metal etch was performed in a commercial ICP reactor using a BCl$_3$/Cl$_2$ chemistry. Parametric testing was done in-line and prior to sinter to capture the shift in device performance induced by the process. Hot carrier stress was performed on antenna devices with and without sinter. Charge pumping measurements were done at 100 Khz with a 2 V symmetric square pulse.

Figure 1:
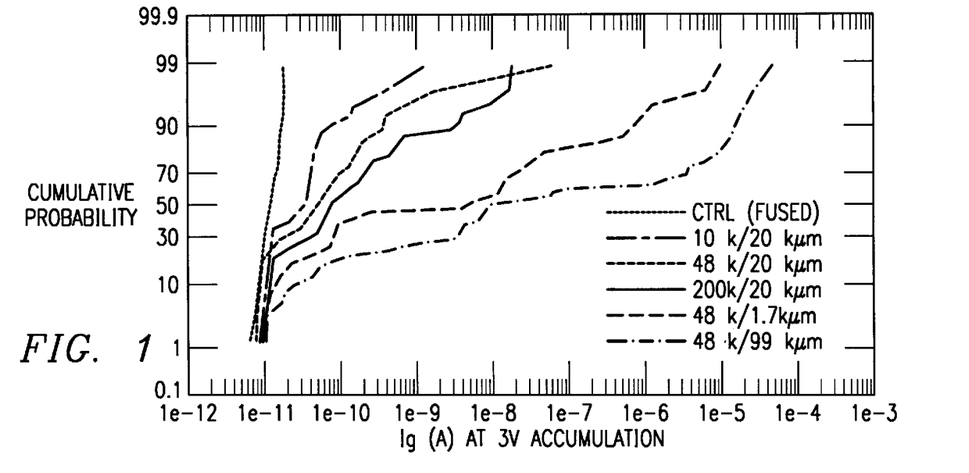
FIG. 1 is a graph of leakage current for various antenna perimeter variations.
Figure 2:
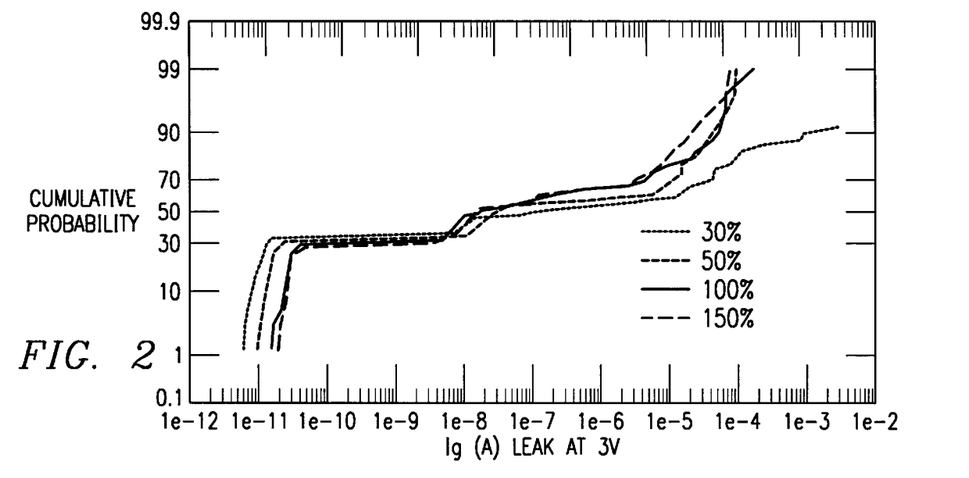
FIG. 2 is a graph of leakage current for various overetch conditions.

A drastic increase was observed in gate leakage current (Ig) for a 60 Å device with increasing antenna ratio or perimeter when processed through a ICP reactor with a chamber height of 5 cm (FIG. 1). Similar results were obtained even with large process variations. However, damage is nearly invariant with the extent of overetch. FIG. 2 shows the effects of overetches from 30% to 150%. Very little change in leakage current is observed. This implies that the charging occurs when the metal is being cleared.

Figure 3:
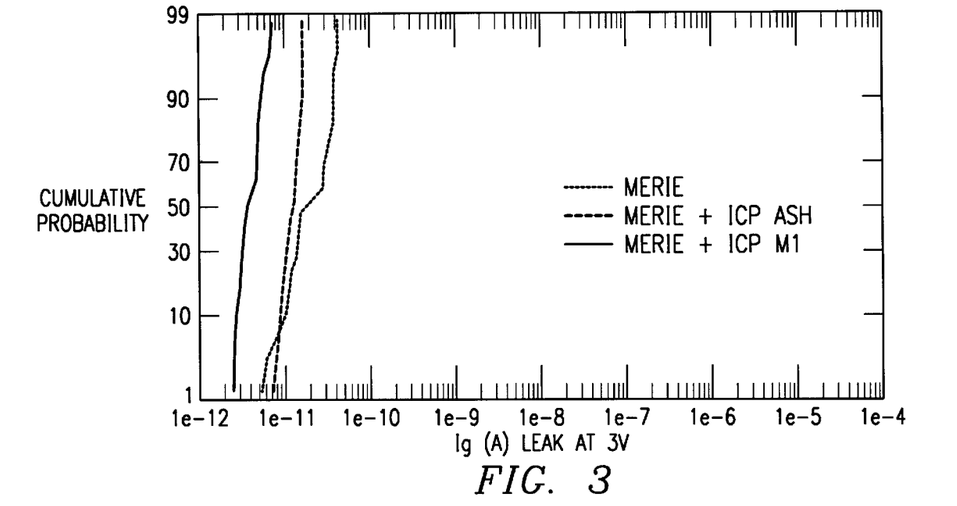
FIG. 3 is a graph of leakage current for several etch conditions.

Next, wafers pre-etched in a low damage MERIE (Magnetically enhanced reactive ion etching) reactor and subsequently re-patterned with a high aspect ratio dummy layout comprising closely spaced lines. When these wafers were subjected to a ICP metal etch, negligible degradation resulted as shown in FIG. 3. FIG. 3 shows gate leakage current of (1) wafers etched in a MERIE reactor, (2) pre-etched wafers with a dummy pattern processed through ICP ash; and (3) pre-etched wafers with a dummy pattern processed through ICP metal etch. However, if the "pre-etched" wafers were instead coated with either CVD aluminum (Al) or titanium-nitride (TiN) for 200–700 Å and then subjected to ICP metal etch, severe damage occurs as indicated in Table 1.

Figure 4A:
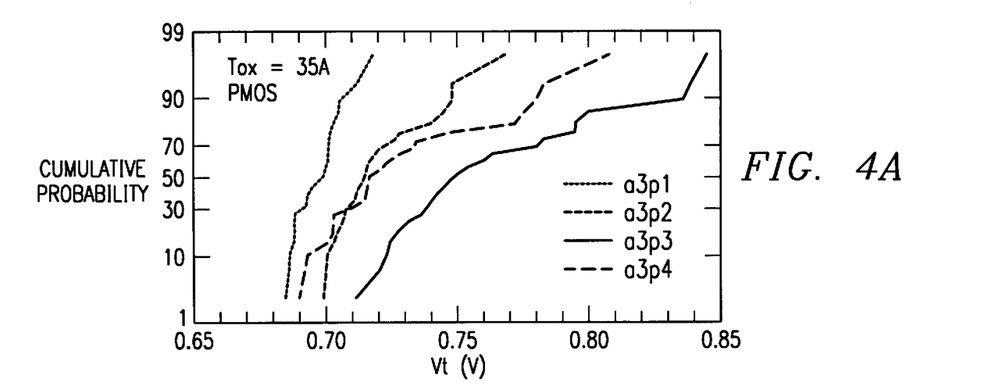
FIG. 4A is a graph of Vt shift for various antenna sizes.

The above three experiments are strong evidence that the damage occurs exclusively during metal clear (endpoint). This suggests that device stress possibly occurs from the interruption of any surface currents generated in the metal during the etch. The aforementioned problem was resolved by improving the hardware, which involved increasing the source to wafer distance to 8 cm. However, even with this hardware optimized for low damage to 60 Å devices, severe charging to 35 Å devices can be observed as shown in FIG. 4A. The Vt of 35 Å devices increase with antenna size indicating severe damage.

Figure 4B:
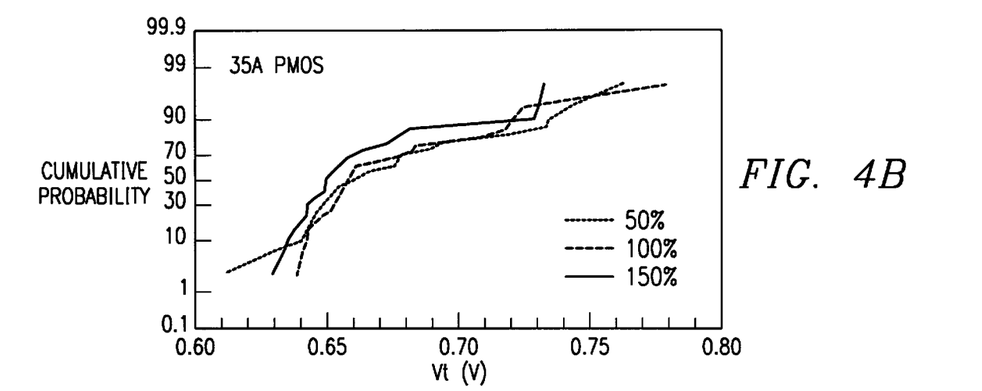
FIG. 4B is a graph of Vt dependence on overetch for a 35 Å gate oxide using a 8 cm gap.
Figure 5:
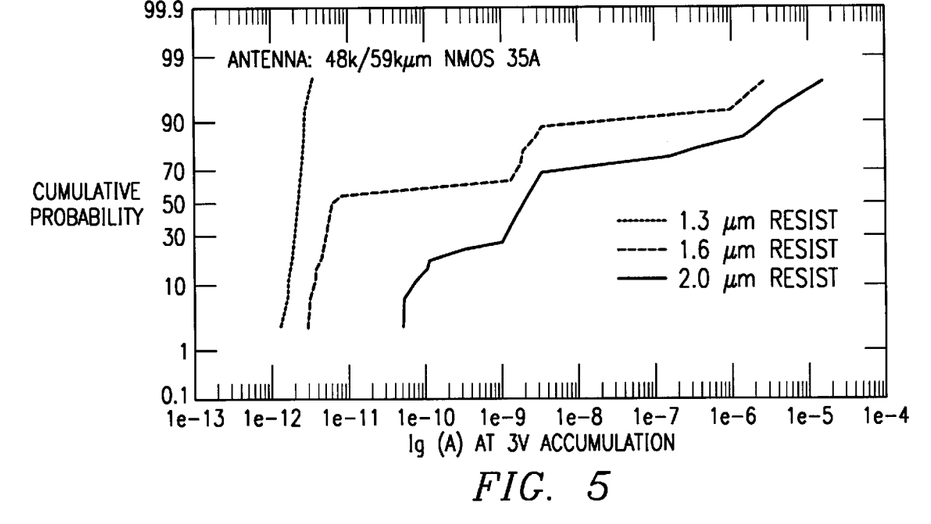
FIG. 5 is a graph of gate leakage for various resist thicknesses.

The Vt (threshold voltage) shift of a 35 Å PMOS device at 8 cm gap spacing is also invariant with the extent of overetch. FIG. 4B shows overetch varying from 50% to 150%. This suggests a damage mechanism similar to that of the 60 Å device at the 5 cm gap. The electron shading effect has been characterized to have similar variance with overetch and is greater at higher aspect ratios. Wafers patterned with thicker resist (1.6 μm or 2.0 μm) show catastrophic increases in leakage current for both NMOS and PMOS devices as shown in FIG. 5. This confirms electron shading as the key mechanism of charging.

Figure 6:
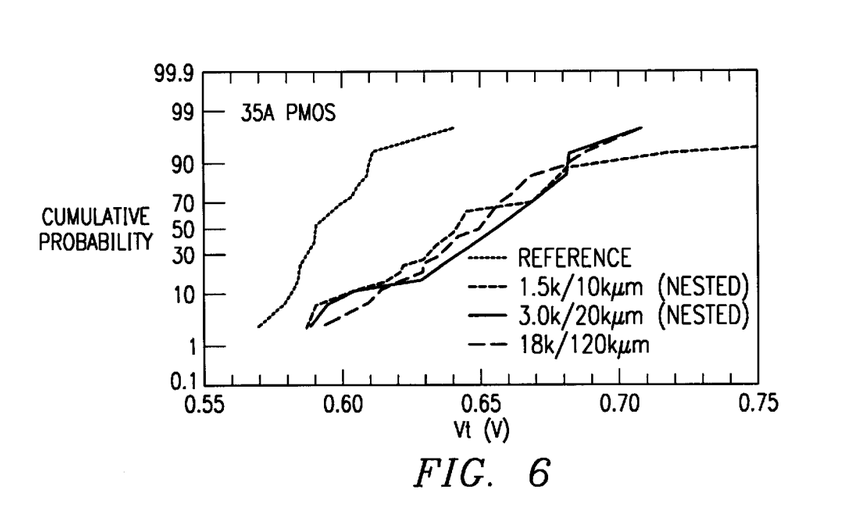
FIG. 6 is a graph of a latent antenna effect for nested antennas.

A latent antenna effect is also observed as shown in FIG. 6. FIG. 6 shows the Vt of PMOS devices connected to a 0.5 μm finger antenna (with 0.5 μm spacing) that are nested. The nested fingers have a perimeter of 120 kum (kilo microns on 1000 μm). The antenna effect of the metal conductor is raised to that of the surrounding geometry. The 10 kum and 20 kum nested fingers show identical Vt shifts compared to the 120 kum perimeter of the surrounding nest. This is attributed to the metal clearing last in tight spaces and charging occurring primarily during metal clear. The reference is a device connected to a bondpad only.

SUPPRESSING PLASMA DAMAGE ACCORDING TO THE INVENTION

The invention utilizes two principles to suppress plasma damage. First, metal etch damage occurs primarily during metal clear and second, due to loading effects, metal in tight spaces clears last. Accordingly, the invention provides a temporary connection between the metal layer and the substrate. This temporary connection is disconnected as the metal is cleared in the tight spaces during the overetch. The invention uses the metal material located between two closely spaced pattern structures to provide at least part of a connection to the substrate As this metal material in the tight space is removed the connection is severed. There are many embodiments that will be apparent to those of ordinary skill in the art. Two specific embodiments are discussed below.

Figure 7:
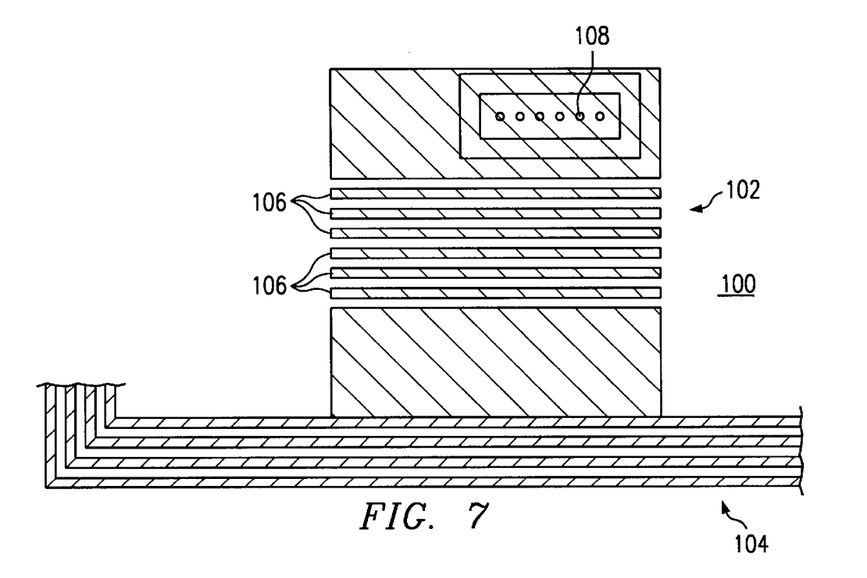
FIG. 7 is a top view of a transient fuse according to the invention.

The first embodiment of the invention is a transient fuse 102, shown in FIG. 7. Transient fuse 102 is located on a semiconductor body 100. Semiconductor body 100 contains transistors (not shown) and at least one, but probably more metal interconnect layers 104. Transient fuse 102 is formed as part of one of the interconnect layers 104. Similar transient fuses 102 may be formed with each interconnect layer. Transient fuse 102 comprises at least two closely spaced metal lines or plates. The metal lines may have a pitch on the order of the design rule used to layout the device. For example, if the design rule for a particular technology required at least 0.25 μm spacing between metal lines of interconnect layer 104, the spacing between metal lines 106 of transient fuse 102 could be on the order of 0.25 μm (for example, 0.20–0.30 μm). Preferably, the pitch of transient fuse 102 is smaller than the spacing between metal lines of interconnect layer 104 for reasons discussed below. In the above discussion, it is assumed that at least portions of interconnect layer 104 are laid out using the minimum design rule. If not, the pitch may also be compared to the minimum spacing between two metal lines of interconnect layer 104. The remaining discussion assumes the minimum design rule is used.

Figure 8:
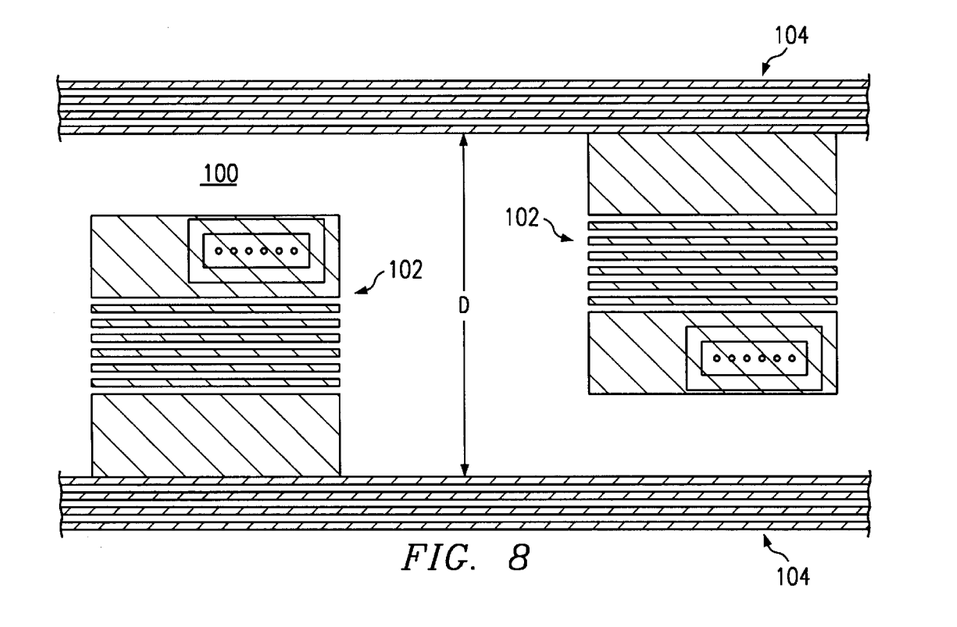
FIG. 8 is a top view of multiple transient fuses according to the invention.
Figure 9:
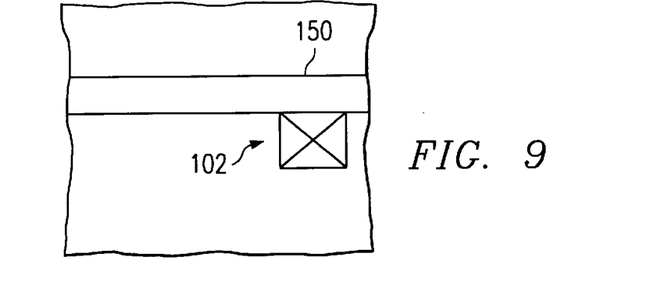
FIG. 9 is a top view of a transient fuse adjacent an isolated line.
Figure 10:
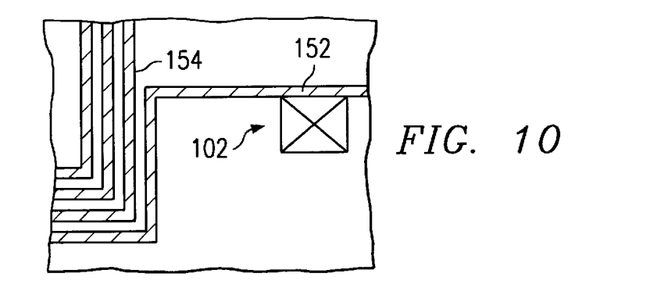
FIG. 10 is a top view of a transient fuse adjacent a partially isolated line.

As shown in FIG. 7, transient fuse 102 is connected to one metal line of a set of minimally spaced metal lines of interconnect layer 104. If there are several sets of minimally spaced metal lines separated from other sets by a distance d greater than the minimum design rule distance, a transient fuse may be placed adjacent each set as shown in FIG. 8. A transient fuse 102 may additionally or alternatively be placed adjacent an isolated line 150 as shown in FIG. 9 as well as adjacent a "partially" isolated line 152, as shown in FIG. 10. "Partially" isolated line 152 is partially isolated because it also forms part of nested lines 154.

Transient fuse 102 is connected so as to dissipate charge from the metal lines of interconnect layer 104. To accomplish this, transient fuse 102 may be connected to the substrate 108. Transient fuse 102 may alternatively be connected to a diode, a well region of semiconductor body 100, a transistor, a capacitor, or other device.

Figure 11A:
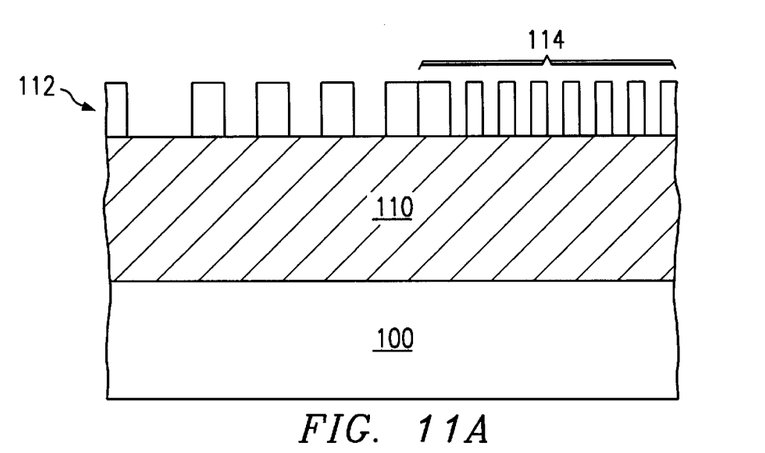
FIGS. 11a–c are cross-sectional views of a fabrication process for the transient fuse of FIG. 18.
Figure 12A:
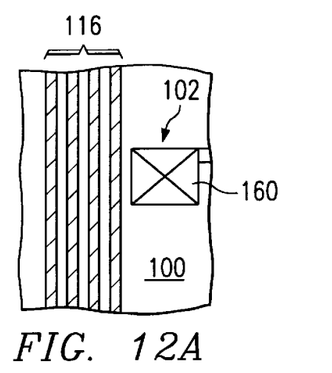
FIGS. 12A&B are top views of transient fuses comprising one and two plates, respectively.
Figure 12B:
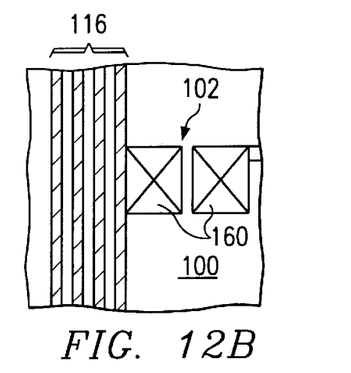

The fabrication and operation of transient fuse 102 will now be discussed. Semiconductor body 100 is processed through the deposition of a layer of metal 110, as shown in FIG. 11a. Metal layer 110 may be part of the first or any subsequent metal interconnect layer. Metal layer 110 is patterned using mask 112, to form the desired interconnect layer. Mask 112 conventionally consists of at least one set of lines separated so as to form the minimum design rule spacing between the subsequently formed metal lines from metal layer 110. In addition to conventional structures, mask 112 also comprises a transient fuse portion 114. Transient fuse portion 114 comprises at least one or two (six are shown) lines separated so as to form a space or spaces between subsequently formed metal lines. The space could also be achieved by placing one or more plates 160 in proximity to the subsequently formed metal lines as shown in FIGS. 12A&B. In the case of one plate 160, it is the space between plate 160 and the nearest of metal lines 116. In the case of multiple plates 160, it is the space between plates 160 that is critical.

Figure 11B:
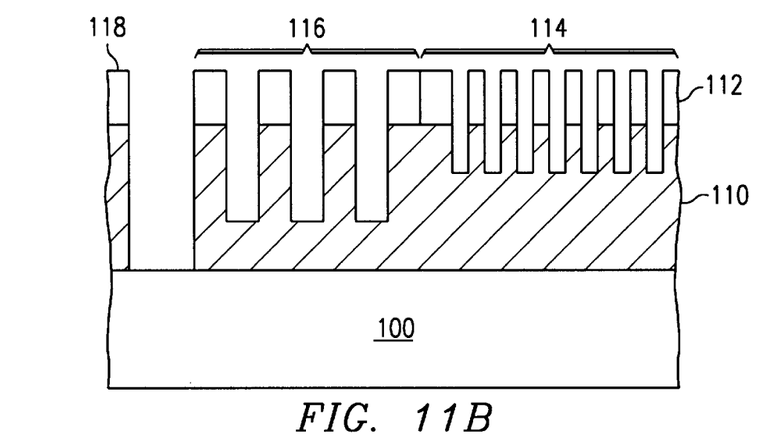
Figure 11C:
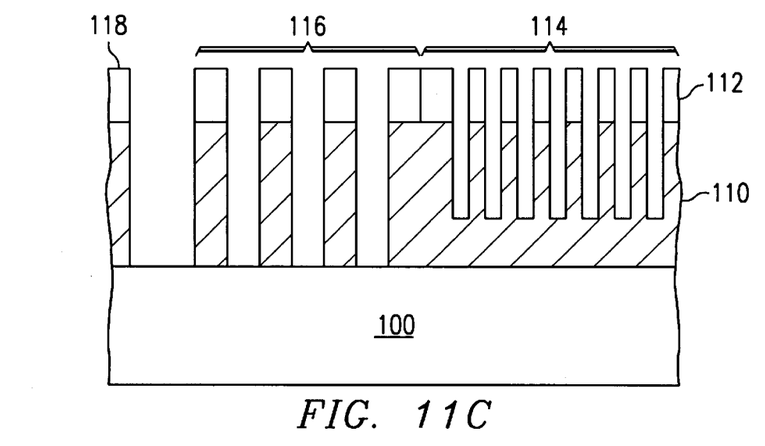

The structure is then subjected to an ICP metal etch as shown in FIG. 11b. As shown in FIG. 11b, the metal between minimum design rule spacing lines 116 contains some metal material after the metal between further spaced lines 118 has disappeared. Thus, there is a connection between the minimum design rule spaced lines 116 through transient fuse 102 to ground 108. Whether the metal between lines 116 clears before, during, or after the metal within transient fuse 102 depends on whether the spacing between metal lines 116 is larger, equal to, or smaller than, respectively, the spacing within transient fuse 102. FIG. 11b, shows the spacing between metals lines 116 as larger than the spacing within transient fuse 102. Because, metal in tight spaces clears last, the metal between lines 116 will clear before the metal within transient fuse 102 in this case as shown in FIG. 11c. As etching continues and the metal material between the lines of transient fuse 102 is removed, the connection to ground 108 is severed.

Figure 13:
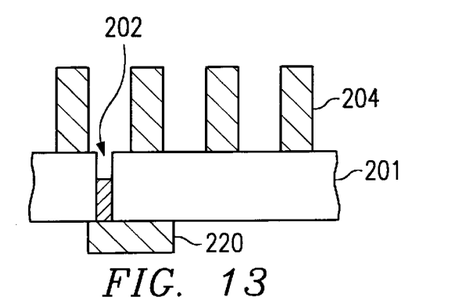
FIG. 13 is a cross-sectional view of a contact/via according to a second embodiment of the invention.
Figure 14:
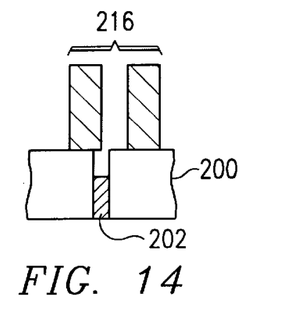
FIG. 14 is a cross-sectional view of a contact/via according to the second embodiment of the invention partially overlapped by a metal line.

A second embodiment of the invention is shown in FIG. 13 and comprises a sacrificial contact/via 202 to ground. Contact/via 202 extends through a dielectric layer 201 to a substrate connection. Alternatively, contact/via 202 may be connected to a protection device such as a diode, transistor, MOS capacitor or a well region. Interconnect layer 204 is formed on dielectric layer 201. Contact/via 202 is placed between two closely spaced lines of interconnect layer 204. More than one contact/via 202 may be used. As in the first embodiment, there may be one for each set of closely spaced lines and they may be formed on multiple interconnect layers. Contact/via may also be placed partially between the lines as shown in FIG. 14. A slight overlap of one of metal lines 216 and contact via 202 may be okay as long as no complete coverage of the contact/via 202 occurs. The slight overlap may occur by design or due to lithography tolerances.

Figure 15A:
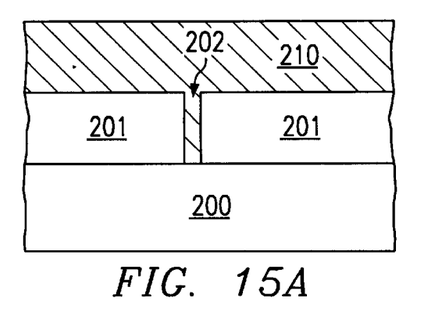
FIGS. 15a–d are cross-sectional views of the contact/via of FIG. 13 at various stages of fabrication.
Figure 15B:
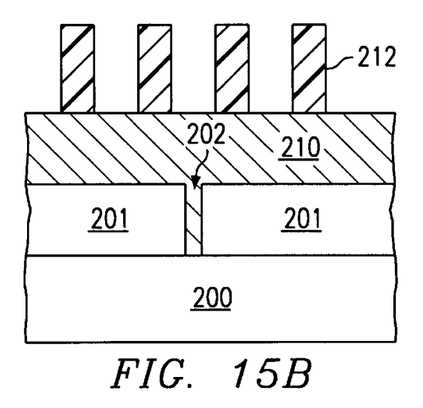

Fabrication and operation of the second embodiment will now be discussed. First, a via 202 is etched through dielectric layer 201, as shown in FIG. 15a. Dielectric layer 201 is the uppermost layer of semiconductor body 200. As above, semiconductor body 200 contains previously formed transistors (not shown). The location of via 202 is chosen so that contact/via 202 will be located between two subsequently formed metal lines. The via 202 is then filled using processes known in the art. Next, a layer of metal 210 is deposited over the structure. Metal layer 210 is then patterned as shown in FIG. 15b using mask 212. Mask 212 is a conventional mask used to form the desired metal interconnect.

Figure 15C:
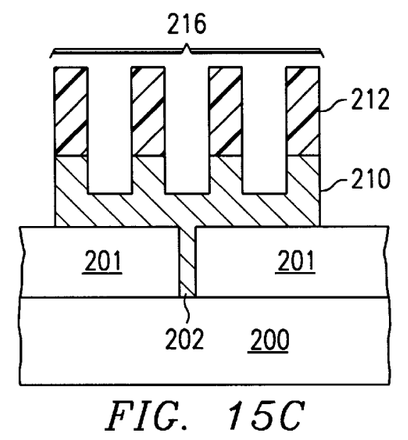

The structure is then subjected to a metal etch as shown in FIG. 15c. As shown in FIG. 15c, the metal between minimum design rule spacing lines 216 contains some metal material after the metal has been cleared in the wider spaces. Thus, there is still a connection between the minimum design rule spaced lines 216 through contact/via 202 to the substrate. As etching continues and the metal material between the lines 216 is removed as well as some of the material within contact/via 202, the connection to substrate is severed.

Figure 15D:
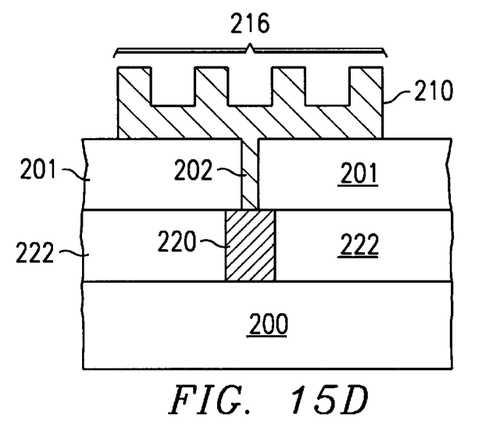

As shown in FIG. 15D, contact/via 202 may be connected to a bottom electrode 220. Bottom electrode 220 may be a contact/via through another dielectric layer 222 to substrate. Bottom electrode 220 may alternatively connect to a device such as a diode, transistor, MOS capacitor, well region, or other device.

The above two embodiments provide a temporary, but firm, connection to substrate during the metal-clearing stages of the metal etch, when damage to devices occurs. This temporary connection to substrate shunts any charging current to substrate thereby suppressing any charge induced damage. The temporary connection is severed during the metal overetch itself and thus is self-disconnecting.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, instead of interconnect layer 104, transient fuse 102 may be used adjacent polysilicon lines during a polysilicon etch. It is therefore intended that the appended claims encompass any such modifications or embodiments.

What is claimed is:

1. A method for suppressing plasma damage to devices during an etch process comprising the steps of:
    depositing a conductive layer;
    forming a pattern over said conductive layer, said pattern including a portion having a plurality of lines spaced a distance on the order of a minimum design rule;
    etching said conductive layer using said pattern, wherein a temporary connection is maintained in said conductive layer during the etch at a location below said portion of said pattern in order to dissipate charge, and wherein said temporary connection is automatically disconnected as material from said conductive layer is cleared between said plurality of lines.

2. The method of claim 1, wherein said conductive layer is a metal interconnect layer.

3. The method of claim 1, wherein said conductive layer comprises polysilicon.

4. The method of claim 1, wherein said distance is less than said minimum design rule.

5. The method of claim 1, wherein said distance is greater than said minimum design rule.

6. The method of claim 1, wherein said distance is approximately equal to said minimum design rule.

7. The method of claim 1, wherein said temporary connection is connected to a substrate.

8. The method of claim 1, wherein said temporary connection is connected to a device.

9. The method of claim 1, wherein said temporary connection is connected to a well region in a substrate.

10. The method of claim 1, wherein said temporary connection is connected to a MOS capacitor.

11. A method for suppressing plasma damage during an etch process comprising the steps of:
    depositing a conductive layer;
    forming a pattern over said conductive layer, said pattern comprising a regular portion and a transient fuse portion having one or more lines spaced a distance on the order of a minimum design rule, said transient fuse portion connected to said regular portion and designed so as to form a temporary connection in said conductive layer for dissipating excess charge;
    etching said conductive layer in a reactor such that material from said conductive layer clears last between said lines of said transient fuse portion, wherein excess charge from said plasma is dissipated during the etch through said temporary connection until said temporary connection is automatically disconnected by said material clearing between said lines of said transient fuse portion.

12. The method of claim 11, wherein said conductive layer is a metal interconnect layer.

13. The method of claim 11, wherein said conductive layer comprises polysilicon.

14. The method of claim 11, wherein said distance is less than said minimum design rule.

15. The method of claim 11, wherein said distance is greater than said minimum design rule.

16. The method of claim 11, wherein said temporary connection is connected to a substrate.

17. The method of claim 11, wherein said temporary connection is connected to a protection device.

18. A method for suppressing plasma damage to devices during a metal etch comprising the steps of:

forming a first via through a dielectric layer to a bottom electrode;

filling said first via to form a sacrificial contact;

depositing a metal layer over said dielectric layer;

patterning said metal layer; and etching said metal layer in a plasma reactor to form a plurality of closely spaced lines, wherein said sacrificial contact is located between two of said plurality of closely spaced lines to temporarily shunt excess charge, continuing said etching step until material from said metal layer is removed from between said plurality of closely spaced lines and a portion of said sacrificial contact is removed thus disconnecting said sacrificial contact from said plurality of closely spaced lines such that said sacrifical contact no longer shunts the excess charge.

19. The method of claim 18, wherein said bottom electrode a second via/contact.

20. The method of claim 18, wherein said bottom electrode is connected to substrate.

21. The method of claim 18, wherein said bottom electrode is a metal line connected to a substrate.

22. The method of claim 18, wherein said bottom electrode is a metal line connected to a device.

23. The method of claim 18, wherein said bottom electrode is a metal lines connected to a well region.

24. The method of claim 18, wherein said bottom electrode is a metal line connected to a MOS capacitor.

25. The method of claim 18, wherein one of said two plurality of closely spaced lines partially overlaps said sacrifical contact.

* * * * *